United States Patent

Holzapfel et al.

[11] Patent Number: 5,872,633
[45] Date of Patent: Feb. 16, 1999

[54] METHODS AND APPARATUS FOR DETECTING REMOVAL OF THIN FILM LAYERS DURING PLANARIZATION

[75] Inventors: Paul Holzapfel, Chandler; James Schlueter, Phoenix; Chris Karlsrud, Chandler, all of Ariz.; Warren Lin, Fremont, Calif.

[73] Assignee: Speedfam Corporation, Chandler, Ariz.

[21] Appl. No.: 798,803

[22] Filed: Feb. 12, 1997

Related U.S. Application Data

[63] Continuation-in-part of Ser. No. 687,710, Jul. 26, 1996.

[51] Int. Cl.$^6$ .............................. G01B 11/06; B24B 49/12
[52] U.S. Cl. .......................... 356/381; 451/6; 250/559.27
[58] Field of Search ..................................... 356/381, 382; 250/559.27; 451/6, 63; 216/60

[56] References Cited

U.S. PATENT DOCUMENTS

| | | |
|---|---|---|
| Re. 34,425 | 11/1993 | Schultz . |
| 4,462,860 | 7/1984 | Szmanda .................. 356/381 |
| 4,805,348 | 2/1989 | Arai et al. . |
| 5,099,614 | 3/1992 | Arai et al. . |
| 5,240,552 | 8/1993 | Yu et al. . |
| 5,329,732 | 7/1994 | Karlsrud et al. . |
| 5,486,129 | 1/1996 | Sandhu et al. . |
| 5,486,701 | 1/1996 | Norton et al. ............. 356/381 |
| 5,498,196 | 3/1996 | Karlsrud et al. . |
| 5,498,199 | 3/1996 | Karlsrud et al. . |
| 5,543,919 | 8/1996 | Munoki ..................... 356/382 |
| 5,555,472 | 9/1996 | Clapis et al. ............. 356/357 |
| 5,555,474 | 9/1996 | Ledger ...................... 356/381 |
| 5,559,428 | 9/1996 | Li et al. .................... 324/71.5 |
| 5,562,529 | 10/1996 | Kishii et al. .............. 451/63 |
| 5,568,252 | 10/1996 | Kusada et al. ............ 356/381 |
| 5,609,511 | 3/1997 | Moriyama et al. . |

FOREIGN PATENT DOCUMENTS

| | | |
|---|---|---|
| 0 663 265 A1 | 7/1995 | European Pat. Off. . |
| 0 718 595 A2 | 6/1996 | European Pat. Off. . |
| 0 738 561 A1 | 10/1996 | European Pat. Off. . |
| 0 806 266 | 11/1997 | European Pat. Off. . |
| WO 96/16436 | 5/1996 | WIPO . |

OTHER PUBLICATIONS

Patent Abstracts Of Japan, vol. 097, No. 010, Oct. 31, 1997 & JP 09 159409 (Dainippon Screen Mfg. Co., Ltd.), Jun. 20, 1997 —see abstract.

*Primary Examiner*—Robert Kim
*Assistant Examiner*—Amanda Merlino
*Attorney, Agent, or Firm*—Snell & Wilmer

[57] ABSTRACT

The present invention provides methods and apparatus which permit the in-process, in-situ, substantially real time measurement of the actual thickness of a surface layer of a work piece, e.g., a semiconductor wafer. A probe is disposed proximate to the outer perimeter of a polishing pad on a CMP table such that the probe establishes optical contact with the wafer surface as a portion of the wafer extends beyond the outer perimeter of the polishing pad. A nozzle may be provided to apply a stream of compressed air at the disk surface under inspection to thereby remove excess slurry from the local region of the workpiece being inspected. A broad band light source is employed in conjunction with a fiber optic cable to direct light at the wafer surface. A bifurcated probe is employed such that the light applied to the workpiece surface is reflected back to and captured by a corresponding optical sensor connected to a fiber optic cable. The captured reflected light received by the receptor sensor and fiber optic cable assembly is applied to a photospectrum meter which analyzes the reflected light. An output signal from the photospectrum meter is transmitted to a processor which includes a smart algorithm configured to calculate the thickness of the surface layer. Alternatively, the reflective characteristics of the semiconductor layers may affect the nature of the reflected signal; changes in the reflected signal can be detected to indicate when a metallic layer has been removed from an oxide layer.

17 Claims, 8 Drawing Sheets

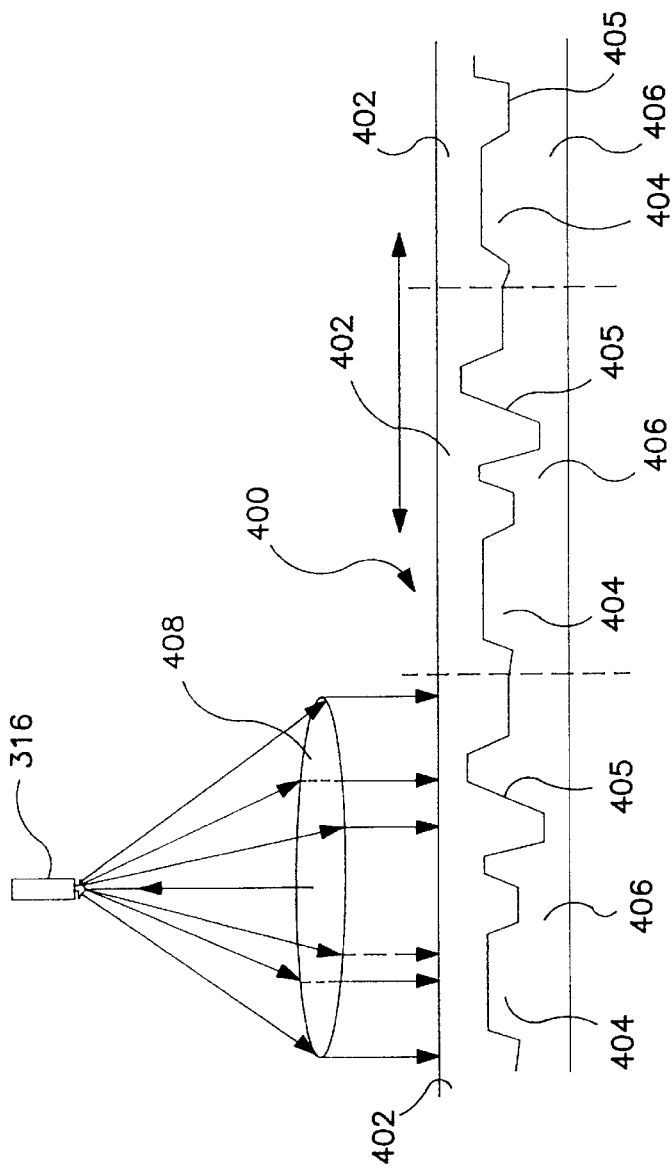
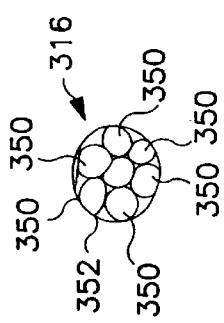
FIG. 4
FIG. 5

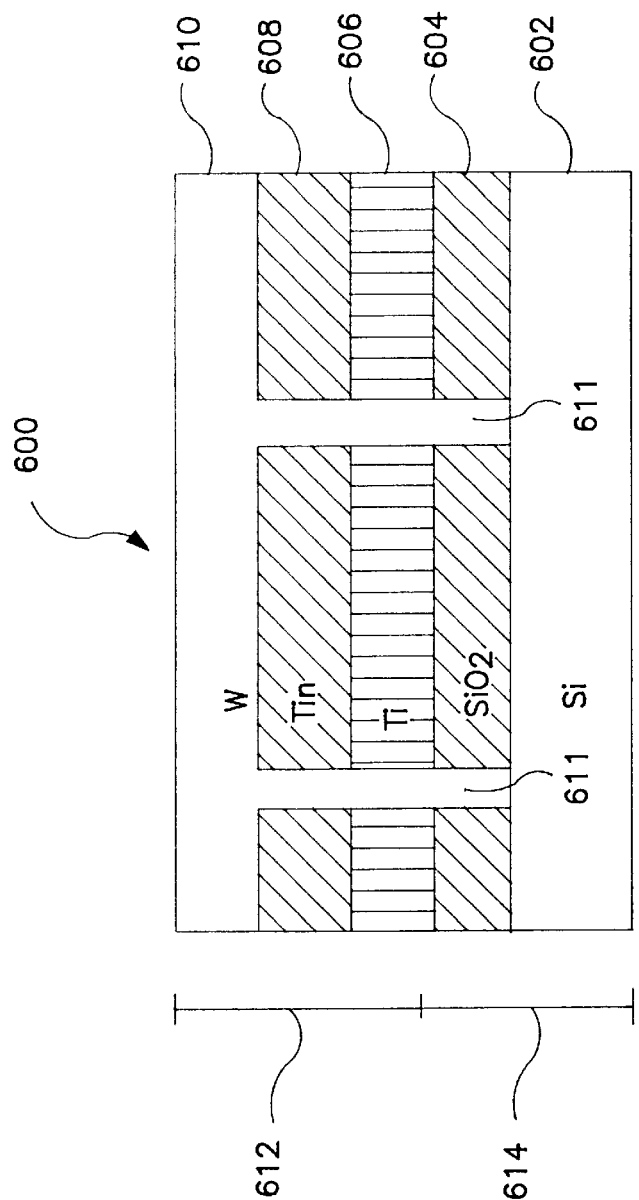
FIG. 10
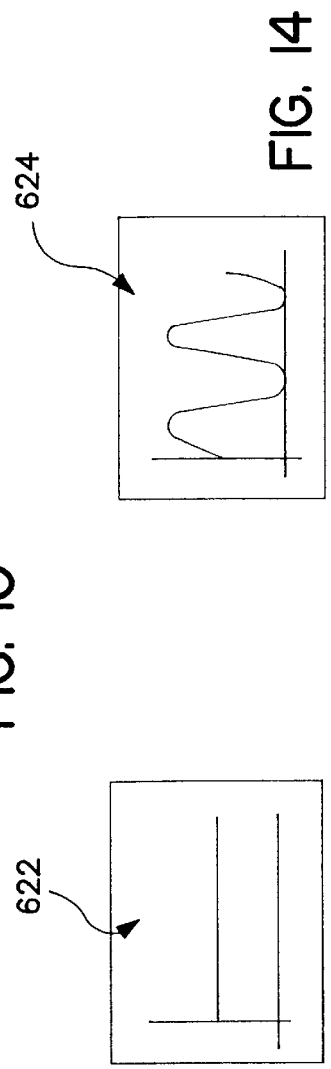
FIG. 14
FIG. 12

5,872,633

METHODS AND APPARATUS FOR DETECTING REMOVAL OF THIN FILM LAYERS DURING PLANARIZATION

RELATED APPLICATION

This application is a Continuation-In-Part of U.S. patent application Ser. No. 08/687,710filed Jul. 26, 1996 and entitled "Methods and Apparatus for the In-Process Measurement of Thin Film Layers".

TECHNICAL FIELD

The present invention relates, generally, to methods and apparatus for measuring the thickness of an oxide layer on a semiconductor workpiece during the planarization process and, more particularly, to a technique for transmitting a broad band light source at the surface of the workpiece to be measured, and analyzing the reflection of the light source to obtain information related to the rate of removal of a layer of material from a semiconductor wafer substrate.

BACKGROUND ART AND TECHNICAL PROBLEMS

The production of integrated circuits begins with the creation of high-quality semiconductor wafers. During the wafer fabrication process, the wafers may undergo multiple masking, etching, and dielectric and conductor deposition processes. Because of the highprecision required in the production of these integrated circuits, an extremely flat surface is generally needed on at least one side of the semiconductor wafer to ensure proper accuracy and performance of the microelectronic structures being created on the wafer surface. As the size of the integrated circuits continues to decrease and the density of microstructures on an integrated circuit increases, the need for precise wafer surfaces becomes more important. Therefore, between each processing step, it is usually necessary to polish or planarize the surface of the wafer to obtain the flattest surface possible.

For a discussion of chemical mechanical planarization (CMP) processes and apparatus, see, for example, Arai, et al., U.S. Pat. No. 4,805,348, issued February, 1989; Arai, et al., U.S. Pat. No. 5,099,614, issued March, 1992; Karlsrud et al., U.S. Pat. No. 5,329,732, issued July, 1994; Karlsrud, U.S. Pat. No. 5,498,196, issued March, 1996; and Karlsrud et al., U.S. Pat. No. 5,498,199, issued March, 1996.

Such polishing is well known in the art and generally includes attaching one side of the wafer to a flat surface of a wafer carrier or chuck and pressing the other side of the wafer against a flat polishing surface. In general, the polishing surface comprises a horizontal polishing pad that has an exposed abrasive surface of, for example, cerium oxide, aluminum oxide, fumed/precipitated silica or other particulate abrasives. Polishing pads can be formed of various materials, as is known in the art, and which are available commercially. Typically, the polishing pad may be a blown polyurethane, such as the IC and GS series of polishing pads available from Rodel Products Corporation in Scottsdale, Ariz. The hardness and density of the polishing pad depends on the material that is to be polished.

During the polishing or planarization process, the workpiece or wafer is typically pressed against the polishing pad surface while the pad rotates about its vertical axis. In addition, to improve the polishing effectiveness, the wafer may also be rotated about its vertical axis and oscillated back and forth over the surface of the polishing pad. It is well known that polishing pads tend to wear unevenly during the polishing operation, causing surface irregularities to develop on the pad. To ensure consistent and accurate planarization and polishing of all workpieces, it is desirable to remove these irregularities.

A well prepared polishing pad facilitates the uniform, high-precision planarization of workpieces. This is particularly important when polishing down the metallic layers to reach the oxide layer on a semiconductor wafer during the manufacture of integrated circuit chips.

Presently known methods for measuring the thickness of an oxide layer on a semiconductor wafer involve measuring the total thickness of an applied oxide layer, determining the desired thickness of the oxide layer after planarization, calculating the pressure to be applied during the polishing or planarization process, and further calculating the approximate time required to remove a predetermined amount of oxide layer for a given pressure and slurry combination. Once the desired removal rate (often expressed in angstroms per minute) is ascertained, a statistical inference is employed to determine the approximate amount of time to remove a desired amount of material. After the wafers have undergone planarization for an amount of time calculated to remove a desired thickness of the oxide layer, the workpieces are removed from the machine and the actual thickness of the oxide layer is measured, for example, through the use of laser interferometric techniques. If it is determined that the oxide layer is still too thick after initial planarization, the workpieces must be reinstalled onto the CMP machine for further oxide layer removal. If, on the other hand, an excessive amount of oxide layer has been removed, it may be necessary to scrap the disks, resulting in substantial unnecessary costs.

Further, the methods of calculating oxide layer thicknesses currently known in the art are principally useful for non-patterned wafers, and generally do not work well on wafers having a substantially repeating surface pattern.

Other techniques may be employed to determine when the layer of tungsten, or other metallic material, has been removed from the oxide layer. Prior art methodologies detect the change in polishing pad motor current, which typically changes in response to the exposure of different semiconductor layers. However, this technique is of limited utility where different slurries and other consumable sets are used during the polishing process. In particular, false trigger may result from an increase or decrease in the surface friction caused by a change in the slurry characteristics rather than by a change in the exposed layer composition. False triggers may also be caused by noise inherent in the polishing system.

Accordingly, a technique is needed which accurately measures the oxide layer (and particularly the end point) thickness which overcomes the shortcoming of the prior art. In addition, a technique is needed which accurately detects the removal of a conductor or semiconductor layer from the oxide substrate layer.

SUMMARY OF THE INVENTION

Accordingly, it is an advantage of the present invention that improved methods and apparatus for measuring the thickness of layers on workpiece surfaces are provided.

Another advantage of the present invention is that it facilitates the in-process, in-situ, substantially real time measurement of the actual thickness of a surface layer of a workpiece under inspection, for example, a semiconductor wafer (either patterned or non-patterned), or the like.

A further advantage is that the present invention employs a smart algorithm configured to calculate the thickness of the oxide layer from information gathered from light signals reflected from the surface of the wafer.

Another advantage of the present invention is that the oxide layer thickness as a function of time is displayed on a view screen for convenient observation by the operator of the machine. Additional functionality may be incorporated into the present invention to enable it to accurately predict the amount of time remaining and the planarization pressure needed to achieve an optimum end point oxide layer thickness.

A further advantage is that the present invention may be alternatively configured to optically detect the endpoint when a metallic layer is removed from the oxide layer during planarization.

BRIEF DESCRIPTION OF THE DRAWINGS

The present invention will hereinafter be described in conjunction with the appended drawing figures, wherein like numerals denote like elements, and:

FIG. 4 is an end view of an exemplary bifurcated probe assembly having a plurality of illuminators and a receiver probe;

FIG. 5 is a schematic view of the probe of FIGS. 3 and 4 sampling an individual die structure of a wafer;

FIG. 10 is a cross sectional depiction of an exemplary semiconductor wafer;

FIG. 12 shows an exemplary output signal generated in response to the sampling of the metallic layer depicted in FIG. 11;

FIG. 14 shows an exemplary output signal generated in response to the sampling of the oxide layer depicted in FIG. 13.

DETAILED DESCRIPTION OF THE PREFERRED EXEMPLARY EMBODIMENTS

The subject invention relates to the in-process detection of characteristics of a layer on a workpiece using a broad spectrum light source, a photospectrum meter, and a controller including a smart algorithm for translating the output of the photospectrum meter to a human readable display relating to the workpiece being examined. The preferred embodiment set forth herein relates to the detection of oxide layer thickness on a semiconductor wafer (either patterned or non-patterned); it will be appreciated, however, that the principles of the present invention may be employed to ascertain any number of characteristics associated with a workpiece surface, including end point detection, the detection of surface irregularities, planarity, and the like.

Figure 1:
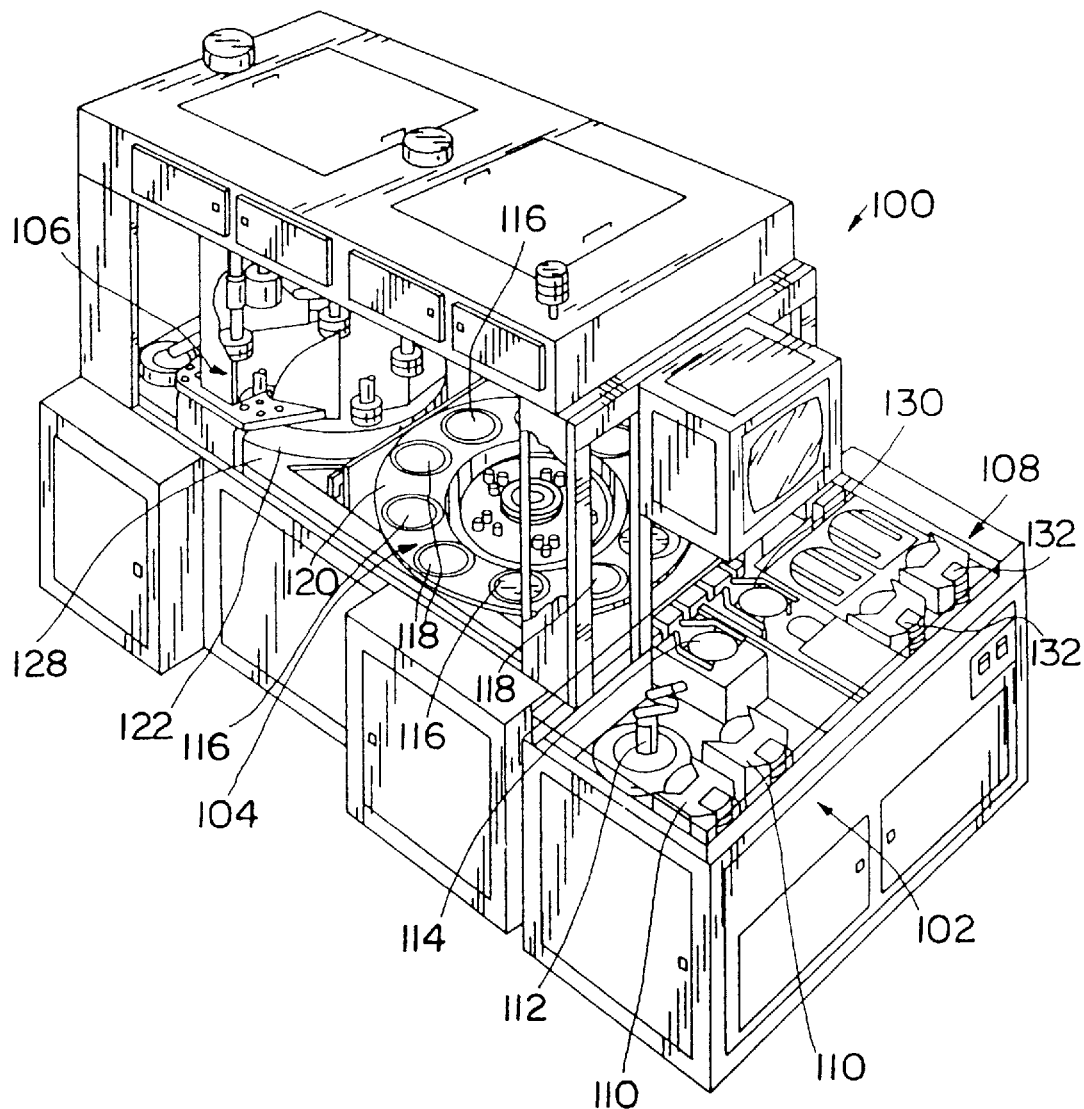
FIG. 1 is a perspective view of an exemplary CMP machine upon which the probe of the present invention is suitably installed.
Figure 2:
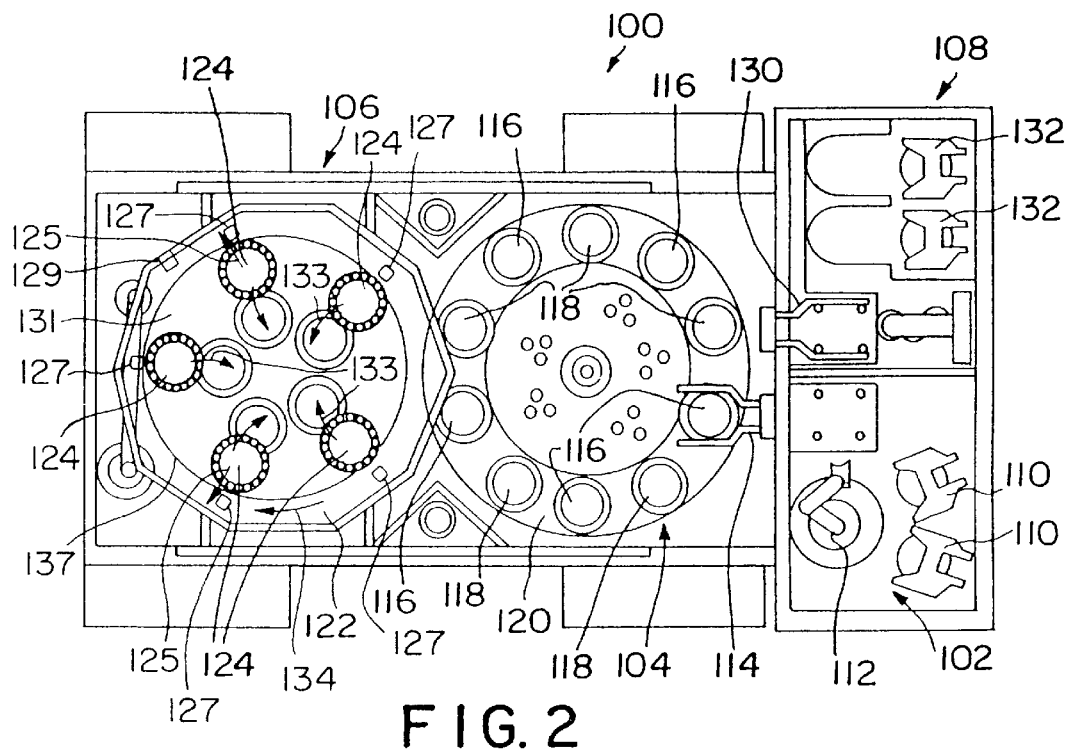
FIG. 2 is a top view of the CMP machine of FIG. 1, showing an exemplary orientation of the probe assemblies of the present invention.

Referring now to FIGS. 1-2, a wafer polishing apparatus 100 is shown embodying the present invention. Wafer polishing apparatus 100 suitably comprises a multiple head wafer polishing machine which accepts wafers from a previous processing step, polishes and rinses the wafers, and reloads the wafers back into wafer cassettes for subsequent processing.

Discussing now the polishing apparatus 100 in more detail, apparatus 100 comprises an unload station 102, a wafer transition station 104, a polishing station 106, and a wafer rinse and load station 108.

In accordance with a preferred embodiment of the invention, cassettes 110, each holding a plurality of wafers, are loaded into the machine at unload station 102. Next, a robotic wafer carrier arm 112 removes the wafers from cassettes 110 and places them, one at a time, on first wafer transfer arm 114. Wafer transfer arm 114 then sequentially lifts and moves each wafer into wafer transition section 104. That is, transfer arm 114 suitably places an individual wafer on one of a plurality of wafer pick-up stations 116 which reside on a rotatable table 120 within wafer transition section 104. Rotatable table 120 also suitably includes a plurality of wafer drop-off stations 118 which alternate with pick-up stations 116. After a wafer is deposited on one of the plurality of pick-up stations 116, table 120 rotates so that a new station 116 aligns with transfer arm 114. Transfer arm 114 then places the next wafer on the new empty pick-up station 116. This process continues until all pick-up stations 116 are filled with wafers. In the illustrated embodiment of the invention, table 120 includes five pick-up stations 116 and five drop-off stations 118.

Next, a wafer carrier apparatus 122, comprising individual wafer carrier elements 124, suitably aligns itself over table 120 so that respective carrier elements 124 are positioned directly above the wafers which reside in respective pick-up stations 116. The carrier apparatus 122 then drops down and picks up the wafers from their respective stations and moves the wafers laterally such that the wafers are positioned above polishing station 106. Once above polishing station 106, carrier apparatus 122 suitably lowers the wafers, which are held by individual elements 124, into operative engagement with a polishing pad 126 which sits atop a lap wheel 128. During operation, lap wheel 128 causes polishing pad 126 to rotate about its vertical axis. At the same time, individual carrier elements 124 spin the wafers about their respective vertical axes and oscillate the wafers back and forth across pad 126 (substantially along arrow 133) as they press against the polishing pad. In this manner, the undersurface of the wafer is polished or planarized.

After an appropriate period of time, the wafers are removed from polishing pad 126, and carrier apparatus 122 transports the wafers back to transition station 104. Carrier apparatus 122 then lowers individual carrier elements 124 and deposits the wafers onto drop-off stations 118. The wafers are then removed from drop-off stations 118 by a second transfer arm 130. Transfer arm 130 suitably lifts each wafer out of transition station 104 and transfers them into wafer rinse and load station 108. In the load station 108, transfer arm 130 holds the wafers while they are rinsed. After a thorough rinsing, the wafers are reloaded into cassettes 132, which then transports the subsequent stations for further processing or packaging.

Although CMP machine 100 is shown having five polishing stations, it will be appreciated that the present invention may be employed in the context of virtually any number polishing stations. Moreover, the present invention may also be employed in circumstances where not all of the polishing stations are functioning at a time. For example, many standard wafer cassettes are capable of carrying up to twenty-five individual workpieces in a single cassette. Consequently, because there are often five workpiece chucks on a single CMP machine, often times the last four disks within a cassette are polished at one time, leaving the fifth disk-holder empty.

With continued reference to FIG. 2, a probe assembly 127 is suitably configured near the outer perimeter edge of polishing pad 126 proximate each carrier element 124. More particularly, in a preferred embodiment of the present invention, each respective carrier element suitably oscillates back and forth along arrow 133; each carrier element 124 also suitably rotates a workpiece about the vertical axis of carrier element 124. At the same time, lap wheel 128 and pad 126 are advantageously configured to rotate about their vertical axis, for example, in a counter clockwise direction as indicated by arrow 134.

In accordance with a particularly preferred embodiment, each carrier element 124 is suitably configured to periodically extend radially outward from the center of table 126 along arrow 125 such that at least a portion of the outside radius of each workpiece extends beyond the outer edge 137 of table 126. By crossing the outer edge of polishing table 126, information relating to surface material thicknesses, desirable material removal rates, and the extent of layer removal may be obtained for the workpieces. As a workpiece extends beyond the outer perimeter of the polishing pad, along line 125, the bottom facing surface of the workpiece may be conveniently optically engaged by probe assembly 127, as described in greater detail below in conjunction with FIG. 3.

In accordance with a further aspect of the present invention, apparatus 100 may be configured with a probe assembly 129 useful for detecting the presence of a wafer or wafer fragment on polishing pad 126 during the polishing process. In accordance with this aspect of the invention, if a wafer or wafer fragment is detected on the pad at a time and/or position indicating an anomaly, the CMP machine 100 may be configured to shut down. A detailed discussion of the operation of probe assembly 129 is discussed in detail in Holzapfel et al., U.S. patent application Ser. No. 08/683,150, filed on Jul. 17, 1996, and entitled *Methods and Apparatus for the In-Process Detection of Workpieces in a CMP Environment*.

Figure 3:
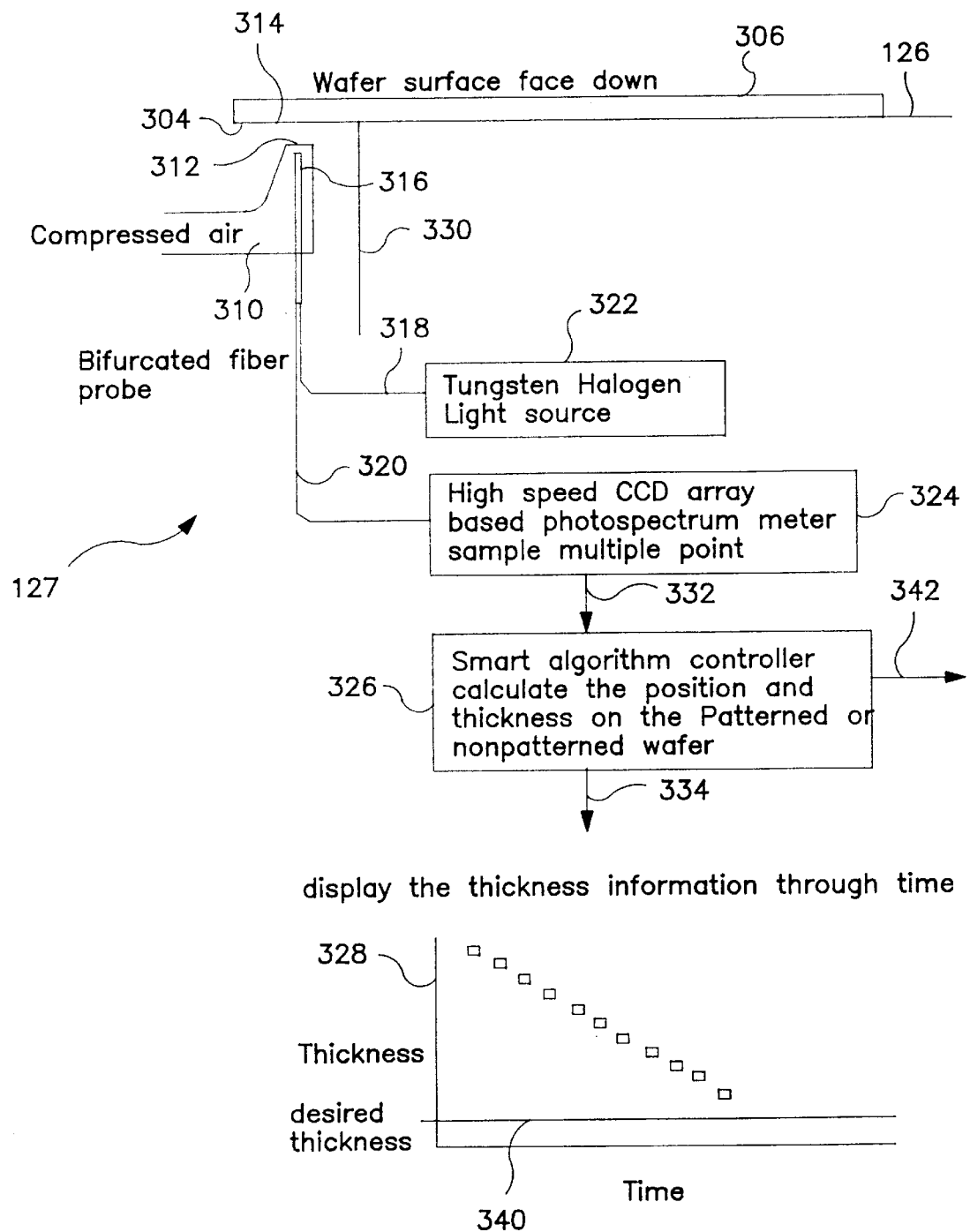
FIG. 3 is a schematic view of a probe in accordance with the present invention configured to sample the surface of a wafer, including a light source, a photospectrum meter, a controller, and a display.

Refferring now to FIG. 3, an exemplary embodiment of probe assembly 127 in accordance with the present invention suitably comprises a housing 310 having a nozzle 312 through which compressed air is suitably directed at the undersurface of a workpiece (e.g., semiconductor wafer disk) 306, a bifurcated fiber probe 316, a light source 322, a photospectrum analyzer 324, a controller/processor 326, and a display 328.

As best seen in FIG. 3, an exemplary workpiece 306 is shown being polished by polishing pad 126 as described above in conjunction with FIGS. 1 and 2. For clarity, carrier element 124 and other components are omitted from FIG. 3. Probe assembly 127 is suitably mounted proximate the outer perimeter 330 of pad 126, such that nozzle 312 may be directed at a bottom surface 304 of workpiece 306 when at least a portion of the workpiece extends off the perimeter edge of polishing pad 126.

In accordance with a particularly preferred embodiment of the present invention, a supply of compressed air, for example in the range of 0 to 20 PSI and most preferably about 5 PSI, is urged through housing 310 and nozzle 312 to facilitate the removal of slurry from an exemplary region 314 on undersurface 304 under examination. As the compressed air clears away slurry from the underside of the workpiece, probe 316 suitably outputs a broad band (e.g., white light) light source at region 314; a portion of the light emitted by probe 316 is reflected or scattered back from region 314 and captured by probe 316. In a preferred embodiment, the light output by probe 316 suitably passes through a collimating lens 408 which collimates the light (see FIG. 5). Thus, while a cross-sectional area of light source (probe) 316 is suitably in the range of 0.1 to 10.0 square millimeters and preferably about 1.0 square millimeter, collimating lens 408 is suitably configured to project the light to cover a region 314 on the wafer undersurface that suitably comprises an area in the range of about 10.0 to about 30.0 square millimeters, and preferably about 20.0 square millimeters.

More particularly and with continued reference to FIGS. 3 and 4, probe 316 suitably comprises a plurality of light illuminators 350 and a single receiver probe 352. In accordance with this aspect of the present invention, probe 316 preferably comprises a plurality of (e.g. six) illuminators 350 suitably configured around a single receiver probe 352 disposed in the center of the illuminators. In accordance with this aspect of the present invention, illuminators 350 may suitably be grouped in a hexagonal configuration. The diameter of each illuminator 350 and the receiver probe 352, as shown in FIG. 4, is suitably about 100 to about 300 microns and preferably about 200 microns. Accordingly, the diameter of probe 316 is suitably in the range of 0.1 to 5 millimeters, and preferably about 0.5 to about 2 millimeters, and most preferably about 1 millimeter. Probe 316 further comprises a transmitter cable 318 through which light is transmitted from light source 322 to illuminators 350 of probe 316 and onto the undersurface of the workpiece. Similarly, probe 316 suitably comprises a receptor cable 320 which receives light from receiver probe 350 and transmits it to photospectrum meter 324. It will be appreciated that the undersurface of the workpiece may be sampled by probe assembly 127 at any desired rate or the sampling may be substantially continuous.

Although the preferred embodiment of light source 322 has been described in accordance with FIGS. 3 and 4, light source 322 may suitably comprise any source capable of applying a desired light signal (e.g. broadband, narrow band, or substantially monochromatic) to the surface of the workpiece. For example, any suitable source (e.g. a tungsten halogen light source) capable of emitting a broad band light signal, for example in the range of 350 to 2000 nanometers, and most preferably in the range of 400 to 850 nanometers, is acceptable. In accordance with the present invention, a suitable halogen light source may comprise a model number L73A98, available from the Gilway Corporation of Massachausetts.

Although cables 318 and 320 suitably comprise fiber optic cables in the preferred embodiment, virtually any conductor may be employed which satisfactorily delivers an appropriate signal (e.g. a light signal) to the workpiece and captures at least a portion of the signal reflected by the workpiece. Moreover, although the preferred embodiment set forth herein employs a light signal, virtually any convenient modality may be employed to interrogate the surface of the workpiece, e.g., an acoustic signal, magnetic signal, or the like.

Photospectrum meter 324 suitably comprises any circuit capable of interpreting the signal reflected from the undersurface of the workpiece. In a preferred embodiment, photospectrum meter 324 suitably comprises a PCMCIA-based photospectrum meter model number PS1000 available from the Mission Peak Optics Company of Fremont, Calif. Alternatively, photospectrum meter 324 may be configured as a PC plug-in device, such as model number PC1000 (also available from the Mission Peak Optics Company).

Controller 326 suitably comprises any general purpose controller capable of receiving 30 an output signal 332 from meter 324 and calculating various parameters from signal 332. In the preferred embodiment, controller 326 is suitably configured to interpret signal 332 and thereby derive the thickness of the oxide layer present in region 314 of workpiece 306. In a particularly preferred embodiment, controller 326 suitably comprises any general purpose personal computer, for example a PC, available from the Mission Peaks Optics Company of Fremont, Calif.

Controller 326 is also suitably configured to output a signal 334 to display terminal 328. In a preferred embodiment, signal 334 is indicative of the thickness of the oxide layer at region 314; it will be understood, however, that signal 334 may embody any suitable information or characteristics about surface 304 of the workpiece, such that any number of parameters may be conveniently displayed on the screen associated with display module 328. For example, signal 334 may convey information indicative of the removal of a first semiconductor layer from a second semiconductor layer (described below). In the embodiment illustrated in FIG. 3, a graph of oxide layer thickness versus time is shown.

With continued reference to FIG. 3, display terminal 328 may be suitably configured to display information pertaining to the undersurface of the workpiece. (e.g., the thickness of the oxide layer or the material composition of the exposed layer) in any desired format. In the thickness versus time graph shown in FIG. 3, the remaining processing time necessary to arrive at a desired thickness 340 may be visually assessed by the operator; alternatively, controller 326 may be configured to "predict" the time necessary to arrive at a desired thickness for a given pressure and also to display the remaining time to the operator. Alternatively, the controller may be configured to transmit a second output signal 342 to the main controller of machine 100, for example to vary the pressure or other operating parameter(s) associated with the particular carrier element 124 corresponding to the workpiece under inspection. For example, if it is desired that all workpieces complete their processing at approximately the same time, and wherein one or more of the workpieces are closer to the desired thickness than other workpieces, it may be advantageous to reduce the pressure for those workpieces where less material remains to be removed and/or to increase the pressure for those workpieces where a relatively larger amount of material remains to be removed.

In this regard, the present inventors have determined that typical desired material removal rates of oxide layers on semiconductor wafers generally range from 1,000–5,000 angstroms per minute, and preferably about 2,500 angstroms per minute. By calculating the differences in thickness over different sampling periods, controller 326 may also be suitably configured to generate a real time or average material removal rate. In accordance with a preferred embodiment, controller 326 may suitably be configured to output signal 342 to increase or decrease the removal rate, as desired.

With continued reference to FIG. 3, probe assembly 127 may be mounted to machine 100 in any convenient way, for example, by attaching probe assembly 127 to the frame associated with machine 100 by any suitable fastening mechanism. Indeed, it may be possible to dispose respective probe housings 310 quite close to the surface of the workpiece, for example in the range of 0.1 to 0.5 inches and most preferably about 0.3 inches from the workpiece. Even though this environment may be sprayed by slurry droplets from time to time, the compressed air ejected from housing 310 by nozzle 312 suitably substantially prevents slurry from entering the housing and corrupting probe 316. One preferred embodiment of an exemplary mounting mechanism is discussed in more detail below in conjunction with FIGS. 7–9.

In accordance with a particularly preferred embodiment, probe assembly 127 may be suitably configured to output signal 342 to machine 100 to thereby terminate the processing of a particular workpiece when it is determined that desired thickness 340 has been achieved. In this way, although it still may be desirable to verify the thickness of the oxide layer once the workpieces have been removed, a very high degree of accuracy in the actual thickness of the oxide layer is obtained. In accordance with this aspect of the present invention, the need to place partially completed wafers back onto machine 100 for further material removal is substantially eliminated. Similarly, the risk of removing too much of the oxide layer, thus degrading the wafers, is also greatly reduced. In this respect, the present invention may be alternatively configured to indicate when the oxide layer is initially exposed (described below).

The manner in which probe assembly 127 samples and interprets the reflected light signals to determine wafer surface thickness will now be described in conjunction with FIGS. 5 and 6.

Figure 6:
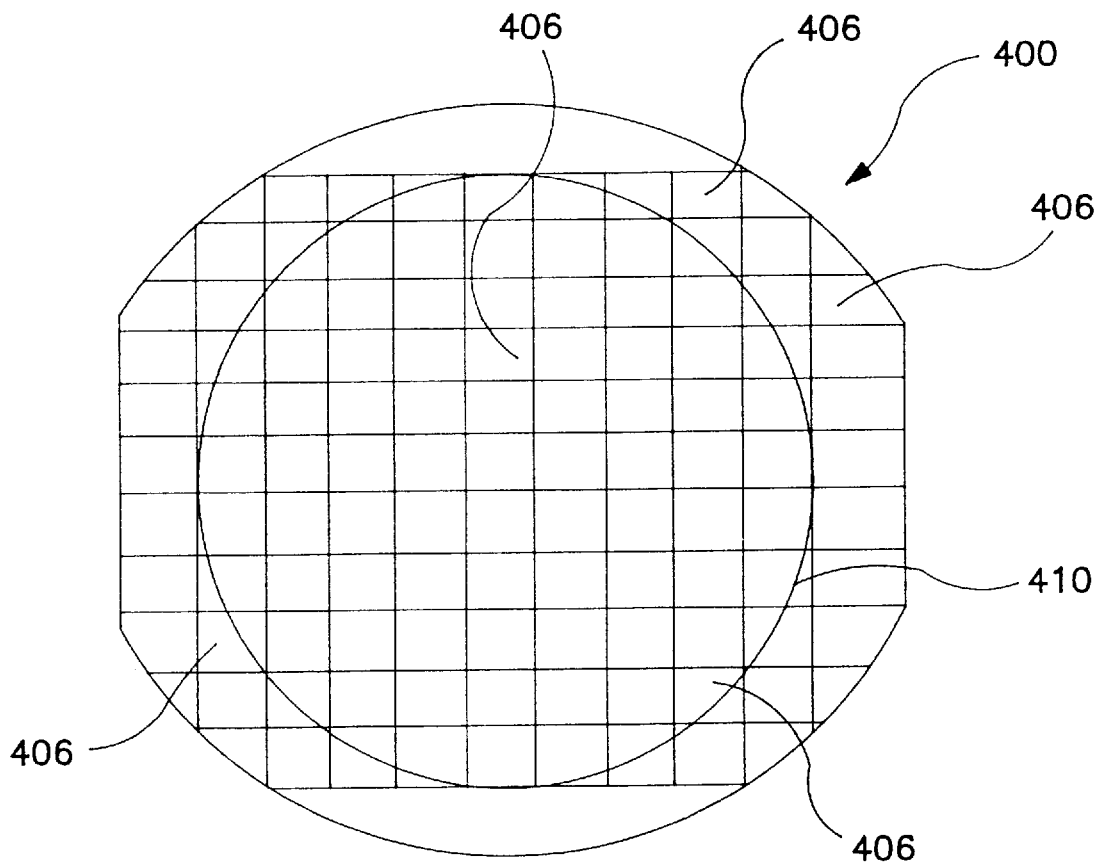
FIG. 6 is a view of one side of a wafer having a plurality of microelectronic die structures disposed thereon.

Referring now to FIG. 6, an exemplary embodiment of a wafer surface comprises a plurality of substantially similar die structures arranged in a rectangular grid pattern. As shown in FIG. 5, each individual die structure 406 may comprise in schematic cross section, one or more alternating substrate and oxide layers; for example, a substrate layer 404 and an oxide layer 402. Substrate layer 404 generally comprises a plurality of microelectronic structures substantially defining a substrate topology 405. Because the surface layer or topology 405 of substrate 404 is non-uniform, it is very difficult to accurately determine the thickness of oxide layer 402 at any particular point on the surface of wafer 400. Therefore, to obtain accurate oxide thickness readings, the effect of the non-uniform substrate surface must be minimized or otherwise accounted for. An exemplary wafer surface sampling and analysis method in accordance with the present invention will now be discussed in greater detail.

In accordance with a particularly preferred embodiment of the present invention, light is transmitted from illuminators 350 of probe 316 through collimating lens 408 and onto the undersurface of wafer 400. Generally, part of the transmitted light will be reflected or scattered from oxide layer 402 back to receiver probe 352. However, a substantial portion of the light passes through oxide layer 402 and reflects off the substrate layer 404 (and more particularly, the non-uniform surface 405). As the light is reflected off the substrate and oxide layers, it passes back through collimating lens 408, which essentially focuses the reflected light back to receiver probe 352. The reflected light then passes to photospectrum meter 324 through fiberoptic cable 320. Photospectrum meter 324 then divides the light into discrete bands of predetermined frequency (or wavelength) ranges and converts the light frequency signals into a digital output signal 332 which is communicated to processor/controller 326.

In accordance with a preferred embodiment, processor 326 analyses the converted light frequency signals according to the well-known photo-interference technique using Fresnel's Equation to obtain the thickness of the oxide layer at the sampled area of the wafer surface. In accordance with this aspect of the present invention, the relationship:

$$\frac{4\pi nd}{\lambda}$$

may be conveniently solved to obtain the oxide thickness, where d= the oxide thickness; n=the refractive index of the sample material (e.g. the oxide layer); and λ=the wavelength of the light.

However, as discussed previously, because the topology of substrate surface 405 is non-uniform, it is very difficult to get an accurate measurement of the thickness of oxide layer 402. Thus, an averaging technique is desirably employed which effectively cancels out many of the effects attributable to the complexity of the topography of the wafer.

The averaging technique will now be discussed in greater detail in conjunction with FIGS. 5 and 6. Referring now to FIG. 6, as discussed previously, an exemplary embodiment of wafer 400 comprises a plurality of die structures 406, each comprising substantially similar or identical substrate topologies. Because of the repeating nature of the die structures, the wafer surface may be advantageously sampled for approximately one full wafer rotation, and the measurements taken during that rotation suitably averaged to largely suppress or even cancel out the effects of the non-uniform topology of the dies. That is, while the sampling of only one die may yield an inaccurate reading of the thickness of the oxide layer, by averaging the sample readings obtained from many similar die structures for one full wafer rotation, the non-uniformity of each die will be effectively canceled out by the averaging technique, thus giving a more accurate oxide thickness reading.

In accordance with this aspect of the present invention, probe 316 suitably collects between about 100 and about 300 samples for one complete rotation, and preferably about 200 samples. Further, one complete rotation of the wafer generally takes approximately 2 seconds; thus, the sampling rate of probe 316 is suitably between about 50 to about 150 samples per second and preferably about 100 samples per second.

The data for each sample is transmitted to processor 326 which stores and accumulates the data. After sampling a portion (e.g. region 314) of the wafer for approximately one full wafer rotation, the accumulated data (approximately 200 samples) is averaged and one average oxide thickness is calculated, for example using the aforementioned Fresnel technique. In accordance with a particularly preferred embodiment of the invention, all the sampled data for one rotation is added together and averaged and then the oxide layer thickness is calculated from the averaged data.

Alternatively, in accordance with yet another preferred embodiment of the invention, an oxide thickness may be calculated for each individual data sample, and thereafter an average thickness calculated from all the individually calculated thicknesses.

In accordance with a particularly preferred embodiment, probe assembly 127, and in particular probe 316, is suitably configured to sample the wafer in a substantially circular path 410 (see FIG. 6) so that each die 406 along path 410 is sampled in a substantially uniform manner. That is, because the die structures on the wafer are in a substantially uniform grid pattern and because the field of view of probe 316 suitably corresponds to approximately one die, the probe is likely to sample a complete die structure (as opposed to simply sampling sections of multiple die structures) as it traverses the wafer in a substantially circular pattern. In accordance with this aspect of the present invention, a wafer carrier lock-in mechanism (discussed in detail below) may be used to ensure that the field of view of the probe follows a substantially circular path around the wafer, thus eliminating a spiral reading effect.

Figure 7:
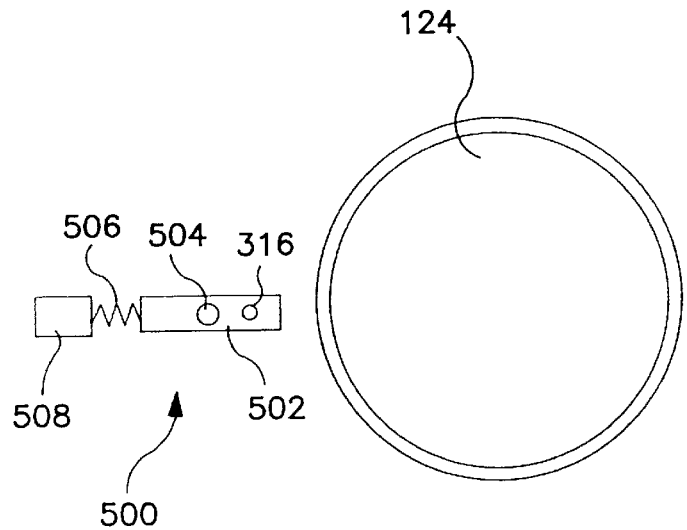
FIG. 7 is a top view of an exemplary embodiment of a wafer carrier lock-in mechanism in accordance with the present invention.
Figure 8:
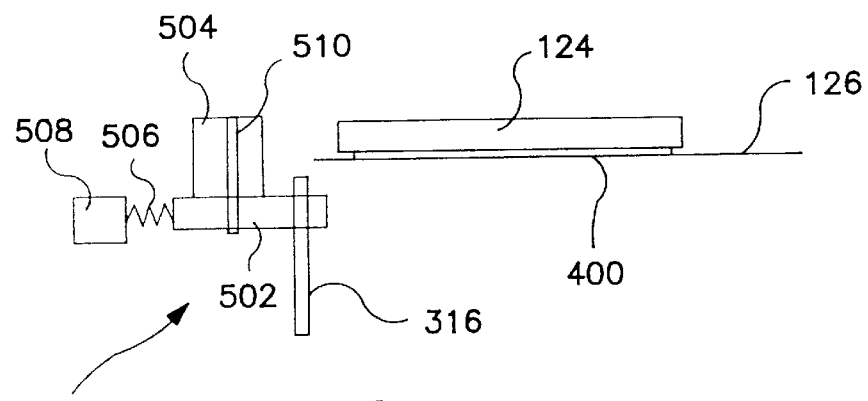
FIG. 8 is a side view of the lock-in mechanism of FIG. 7.
Figure 9:
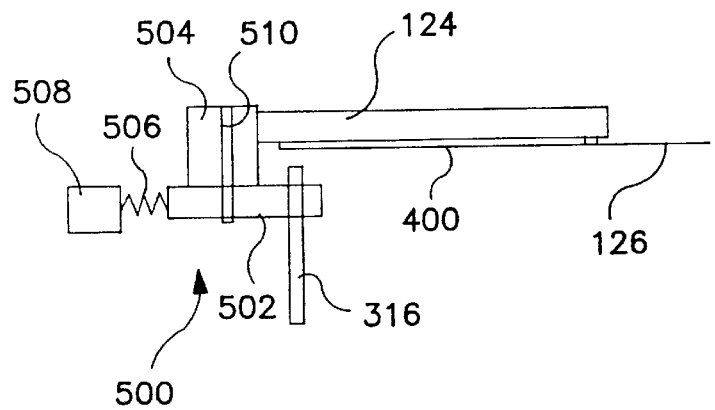
FIG. 9 is a side view of the lock-in mechanism of FIGS. 7 and 8 with a carrier arid wafer assembly in operative engagement with the lock-in mechanism.

Wafer carrier lock-in mechanism 500 will now be discussed in greater detail in conjunction with FIGS. 7–9. An exemplary embodiment of wafer lock-in mechanism 500 preferably comprises a base 502, a rotatable carrier guide 504, a spring 506 and a stopper 508. Rotatable carrier guide 504 is suitably mounted to base 502 with a bearing assembly 510 to permit free rotation of guide 504. Further, spring 506 is suitably mounted between base 502 and stopper 508. Finally, probe 316 is securely mounted within base 502 so that the illuminators and receptor probe are pointed upward toward wafer 400 and wafer carrier element 124.

During operation, wafer carrier 124 rotates about its vertical axis and oscillates back and forth across polishing pad 126. As carrier element 124 oscillates across the pad, a portion of the carrier element periodically extends beyond the edge of the pad, contacting rotating carrier guide 504. Carrier guide 504 suitably rotates about bearing 510 as carrier element 124 rotates, thus minimizing friction between the two elements. Once carrier element 124 contacts guide 504, the field of view of probe 316 becomes fixed at a specific radial point on wafer 400. In accordance with this aspect of the invention, as the carrier and wafer assembly rotate, the field of view of the probe traverses a substantially circular path around the wafer ensuring relatively accurate readings.

In accordance with an exemplary embodiment of the present invention, as the carrier and wafer assembly continue to oscillate further out from the pad, the carrier pushes probe 316, guide 504, and base 502 assembly towards stopper 508, compressing spring 506. Then, as the carrier and wafer assembly begin to oscillate back towards the center of polishing pad 126, the tension in spring 506 causes base 502, carrier guide 504, and probe 316 assembly to remain in contact with and to move with the carrier element and wafer, thus maintaining the position of the probe's field of view on the wafer. Accordingly, as the lock-in mechanism 500 moves with the carrier and wafer assembly, the probe maintains a substantially circular field of view around the wafer as the carrier and wafer rotate and oscillate back and forth across the pad, and therefore, preventing the probe from sampling along a less desirable spiral path on the surface of the wafer.

As mentioned above, the present invention may also be employed to detect when a first material layer, e.g., a tungsten or titanium layer, has been removed from a second material layer, e.g., an oxide layer. It should be noted that the present invention may be suitably adapted to detect semiconductor, conductor, or other layers that may be present on a semiconductor wafer. Semiconductor layers are described herein for illustrative purposes only, and the present invention is not limited to the detection of such layers. FIG. 10 is a cross sectional representation of an exemplary semiconductor wafer 600. Of course, the dimensions of wafer 600 are exaggerated for illustrative purposes. Wafer 600 may include a silicon substrate base 602, an oxide (silicon dioxide) layer 604, a titanium layer 606, a titanium nitride layer 608, and a tungsten layer 610. In accordance with conventional semiconductor fabrication techniques, a number of plugs 611 may be formed within wafer 600.

During planarization, the metallic upper layers, e.g., tungsten layer 610, titanium nitride layer 608, and titanium layer 606, are removed from wafer 600, while some material is maintained within the associated plugs 611. Preferably, material removal terminates (or slows down) when oxide layer 604 is exposed. As described above, the present invention may be employed to measure the thickness of oxide layer 604 to optimize the planarization process.

Those skilled in the art will appreciate that the specific layering configuration and the composition of the various layers may vary from wafer to wafer depending on the device being created.

For purposes of the following description, a first region 612 of wafer 600 may be defined as that portion of wafer 600 above oxide layer 604. A second region 614 may be defined as that portion of wafer 600 that includes oxide layer 604, silicon base 602, and any other layers (not shown) that may be formed below oxide layer 604. It should be appreciated that although the transition from titanium layer 606 to oxide layer 604 is described herein, the present invention may be suitably adapted to detect the transition from any two material layers having distinguishable optical reflective characteristics. Such adaptation may require additional or alternative processing and/or the application of different detection algorithms than those described above.

Figure 11:
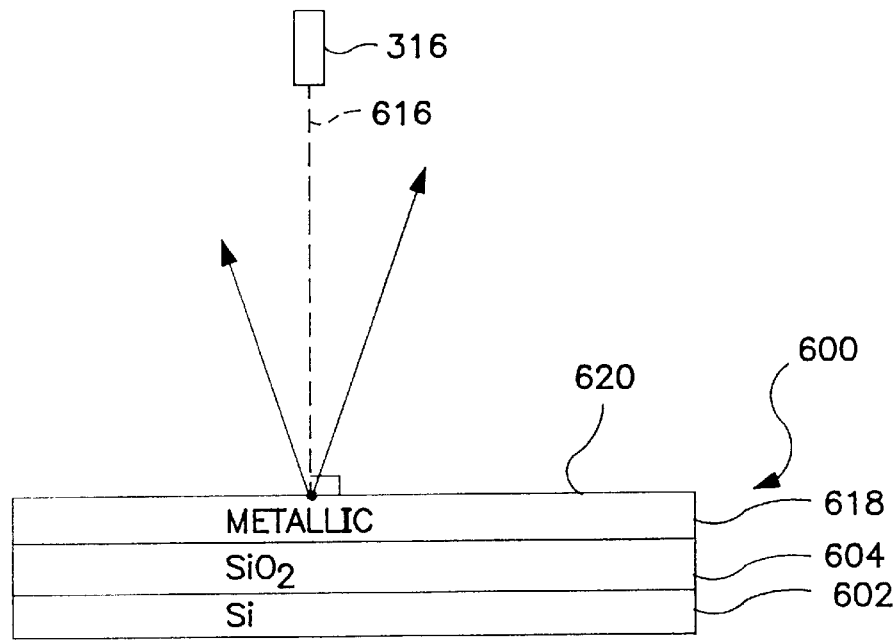
FIG. 11 is a schematic view of a probe sampling a metallic layer of the semiconductor wafer shown in FIG. 10.

The metallic layer endpoint detection feature takes advantage of the distinguishable reflective characteristics of the various semiconductor layers within wafer 600. FIG. 11 shows probe 316 (see FIGS. 3 and 5) directing an input interrogation signal 616 at wafer 600. Input signal 616 may be directed toward wafer 600 at an angle of approximately 80 to 100 degrees, and preferably at an angle of approximately 90 degrees, relative to the upper surface 620 of wafer 600. The "metallic" layer 618 shown in FIG. 11 is intended to generically indicate any semiconductor material of a metallic composition, e.g., tungsten, copper, titanium, titanium or the like. The metallic nature of layer 618 causes input signal 616 to reflect from layer 618.

FIG. 12 depicts an exemplary output 622 that may be generated in response to the continued presence of metallic layer 618 and displayed on display terminal 328 (see FIG. 3 and accompanying discussion). A flat output (or any other predetermined display or indicator) may indicate that the reflected signal detected at probe 316 is less than a predetermined threshold value. Alternatively, the same output may indicate that the reflected signal detected at probe 316 has certain detectable characteristics that are distinguishable from a signal reflected from oxide layer 604. For example, the reflected signal itself may have monotonic characteristics when reflected from metallic layer 618 and sinusoidal characteristics when reflected from oxide layer 604 (or a nonmetallic layer).

In accordance with a further aspect of the present embodiment of the invention, in addition to generating such a display, wafer polishing apparatus 100 may be instructed, by suitable processing and control elements, to continue with the planarization procedure, i.e., to continue removing additional layers or more material from the present layer.

Figure 13:
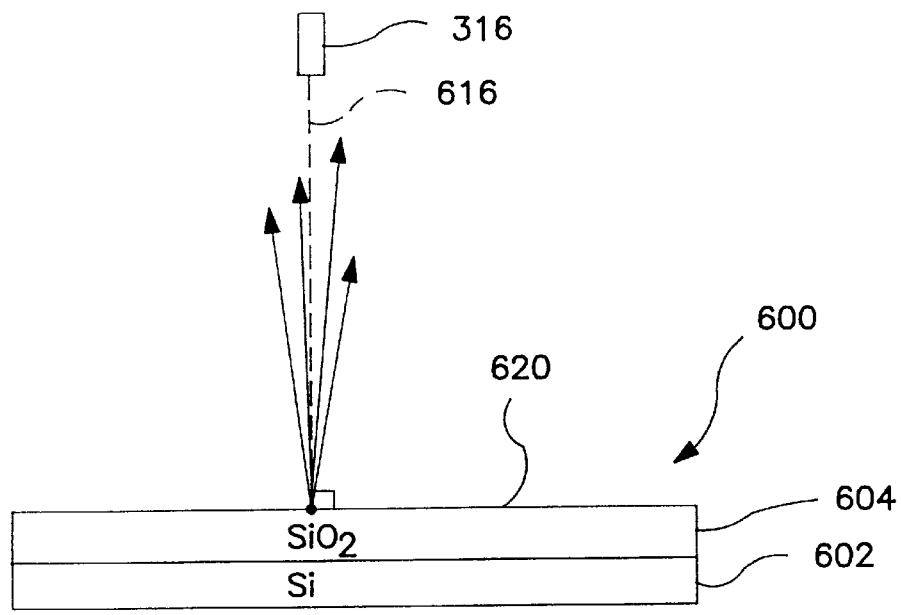
FIG. 13 is a schematic view of a probe sampling an oxide layer of the semiconductor wafer shown in FIG. 10.

FIG. 13 shows probe 316 directing input signal 616 at wafer 600 after the planarization process has exposed oxide layer 604. As shown, the metallic layer 618 has been removed from wafer 600. Although not shown in FIG. 13, various plugs 611 formed from tungsten may remain embedded in oxide layer 604 (see, for example, FIG. 10). FIG. 14 depicts an exemplary output 624 that may be displayed on display terminal 328 after oxide layer 604 has become exposed. A sinusoidal output (or any other predetermined display or indicator) may indicate that the reflected signal detected at probe 316 is greater than the predetermined threshold value. Alternatively, the same output may indicate that the reflected signal detected at probe 316 has certain detectable characteristics that are distinguishable from a signal reflected from metallic layer 618. For example, the reflected signal may become sinusoidal in nature after the metallic layer 618 has been cleared away and oxide layer 604 becomes the reflective surface. In addition, suitable control processes may cause wafer polishing apparatus 100 to halt the planarization procedure or slow the procedure down such that subsequent removal of material may be closely monitored.

It should be appreciated that the detection of oxide layer 604 in this manner is substantially independent of the amount and type of slurry and other consumables that may be present in the CMP environment. Unlike conventional endpoint detection techniques that depend on mechanical characteristics such as polishing pad friction and motor currents, the present invention can effectively detect the removal of a metallic layer without relying upon physical interaction with the system. Those skilled in the art will appreciate that the present invention may be utilized to detect the transition between any two reflectively distinguishable materials during a removal or planarization process. For example, if required, the processing and display functions of the present invention may be appropriately modified to detect the removal of an oxide layer from a metallic layer, or one metallic layer from another metallic layer.

In summary, the present invention provides improved methods and apparatus for measuring the thickness of layers on semiconductor wafers and other workpiece surfaces. The present invention facilitates the in-process, in-situ, substantially real time measurement of the actual thickness of a surface layer of a workpiece under inspection. A smart algorithm is employed to calculate the thickness of the oxide layer from information gathered from light signals reflected from the surface of the wafer. In a preferred embodiment, the oxide layer thickness as a function of time is displayed on a view screen for convenient observation by the operator of the machine. In accordance with a different embodiment of the invention, the present invention may be alternatively configured to optically detect the endpoint when a metallic layer is removed from the oxide layer during the planarization process.

Although the subject invention is described herein in conjunction with the appended drawing figures, it will be appreciated that the invention is not limited to the specific form shown. Various modifications in the selection and arrangement of parts, components, and processing steps may be made in the implementation of the invention. For example, although a preferred embodiment is set forth in which a tungsten halogen light source is used in connection with fiber optic conductors, it will be appreciated that virtually any interrogation signal may be employed through appropriate conductors, such that in-process, in-situ monitoring of workpiece surface parameters are made available for analyses. Moreover, although the light source, photo-spectrum meter, controller, and terminal display are illustrated in FIG. 3 in schematic form, it will be appreciated that only the probe 316 need be disposed proximate the workpieces various of the other components, including the light source, photospectrum meter, controller, and screen display may be disposed remotely from the workpiece, as desired. These and other modifications may be made in the design and arrangement of the various components which implement the invention without departing from the spirit and scope of the invention as set forth in the appended claims.

What is claimed is:

1. In a planarization system configured to process a semiconductor wafer initially having at least a first material layer formed over a second material layer, a method for detecting the removal of said first material layer from said semiconductor wafer during operation of said planarization system, said method comprising the steps of:

directing a broadband input interrogation signal at a portion of said first material layer, said broadband input interrogation signal having a plurality of wavelength components;

detecting a reflected portion of said broadband input interrogation signal reflected directly from said first material layer;

analyzing characteristics of said reflected portion of said broadband input interrogation signal;

directing a second broadband input interrogation signal at a portion of said second material layer after removal of said first material layer, said second broadband input interrogation signal having a plurality of wavelength components;

detecting a reflected signal produced in response to said second broadband input interrogation signal;

analyzing characteristics of said reflected signal; and indicating removal of said first material layer from said semiconductor wafer in response to characteristics of said reflected signal, where characteristics of said reflected signal differ from characteristics of said reflected portion of said input interrogation signal.

2. A method according to claim 1, wherein said indicating step is performed when said reflected signal has sinusoidal characteristics.

3. A method according to claim 1, further comprising the step of displaying a human readable output indicative of removal of said first material layer from said semiconductor wafer.

4. A method according to claim 1, further comprising the step of adjusting an operational parameter of said planarization system in response to said indicating step.

5. An apparatus for detecting removal of a first material layer initially formed over a second material layer on a semiconductor wafer during a planarization procedure, said apparatus comprising:

means for generating input signal for establishing optical communication with a surface of said semiconductor wafer during said planarization procedure; said broadband input interrogation signal having a plurality of wavelength components;

a receptor configured to receive a reflected signal produced in response to said input signal, said reflected directly from said first material layer, and said receptor being further configured to receive a reflected signal produced in response to a second broadband input interrogation signal directed at said material layer after removal of said first material layer, said second broadband input interrogation signal having a plurality of wavelength components; and a processor configured to process said reflected portion of said broadband input interrogation signal to thereby produce a first output signal having a first characteristic indicative of the presence of said first material layer and to process said reflected signal to thereby produce a second output signal having a second characteristic indicative of the exposure of said second material layer.

6. An apparatus according to claim 5, wherein said means for generating comprises a substantially white light source and wherein each of said broadband input interrogation signal and said second broadband input interrogation signal is a broadband light signal having a plurality of wavelength components within the range of 350 to 2000 nanometers.

7. An apparatus according to claim 5, wherein said processor produces said first output signal when said reflected signal exhibits monotonic characteristics.

8. An apparatus according to claim 5, wherein said processor produces said second output signal when said reflected signal has sinusoidal characteristics.

9. An apparatus according to claim 5, further comprising a display terminal for displaying a human readable output indicative of removal of said first material layer from said semiconductor wafer.

10. An apparatus according to claim 5, wherein said semiconductor wafer has a planar surface and said means for generating is positioned such that said broadband input interrogation signal is directed toward said semiconductor wafer at an angle between 80 and 110 degrees relative to said upper surface.

11. An apparatus according to claim 5, wherein said first material layer comprises a material selected from the group consisting of copper, tungsten, titanium, and titanium nitride.

12. An apparatus according to claim 5, wherein said second material layer comprises an oxide composition.

13. A method for detecting removal of a first material layer initially formed above a second material layer on a semiconductor wafer, said method comprising the steps of:

applying a broadband input interrogation signal to an exposed surface of said first material layer;

detecting a reflected signal soley associated with a portion of said broadband input interrogation signal reflected from said first material layer;

conducting a planarization procedure on said semiconductor wafer to thereby remove said first material layer;

detecting a second reflected signal reflected from said second material layer and produced in response to said broadband input interrogation signal, said second material layer having different optical reflective characteristics relative to said first material layer; and indicating removal of said first material layer from said semiconductor wafer in response to said second reflected signal.

14. A method according to claim 13, further comprising the step of halting said planarization procedure in response to said indicating step.

15. A method according to claim 13, wherein said first material layer comprises a metallic composition and said second material layer comprises an oxide composition.

16. A method according to claim 13, further comprising the step of analyzing characteristics of said second reflected signal to thereby indicate the presence of said first material layer.

17. A method according to claim 13, further comprising the step of analyzing characteristics of said reflected signal to thereby indicate the presence of said first material layer.

* * * * *